(12) United States Patent
Chien et al.

(10) Patent No.: US 6,432,827 B1
(45) Date of Patent: Aug. 13, 2002

(54) ILD PLANARIZATION METHOD

(75) Inventors: Sun-Chieh Chien; De-Yuan Wu, both of Hsin-Chu; Yung-Chung Lin, Feng-Yuan, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/725,027

(22) Filed: Nov. 29, 2000

(51) Int. Cl.[7] .............................................. H01L 21/461
(52) U.S. Cl. ........................................ 438/692; 438/694
(58) Field of Search ................................. 438/692–693, 438/694, 621–633, 761, 624–626

(56) References Cited

U.S. PATENT DOCUMENTS

| | | | |
|---|---|---|---|
| 5,552,346 A | * 9/1996 | Huang et al. | 437/228 |
| 6,180,448 B1 | * 1/2001 | Lee | 438/253 |
| 6,204,184 B1 | * 3/2001 | Nishida et al. | 438/692 |
| 6,239,020 B1 | * 5/2001 | Lou | 438/692 |
| 6,274,509 B1 | * 8/2001 | Hsieh et al. | 438/761 |
| 6,323,102 B1 | * 11/2001 | Horita et al. | 438/692 |

* cited by examiner

Primary Examiner—Robert Kunemund
Assistant Examiner—Duy-Vu Deo
(74) Attorney, Agent, or Firm—Winston Hsu (57) ABSTRACT

The present invention provides a method of planarization for an inter layer dielectric of an EDRAM. The method comprises defining a periphery circuit region and a memory array area on a semiconductor wafer of the EDRAM, and forming a plurality of MOS transistors and capacitors. As well, both a dielectric layer and a photoresist layer are formed on the semiconductor wafer using the layout patterns of a storage node of thecapacitors as a reverse mask to perform an etching process. Consequently, portions of the photoresist layer in the memory array area are removed while simultaneously etching the dielectric layer in the memory array area by a predetermined depth. Finally, a chemical mechanical polishing process is performed on the dielectric layer to planarize the inter layer dielectric of the EDRAM.

6 Claims, 9 Drawing Sheets

ILD PLANARIZATION METHOD

BACKGROUND OF THE INVENTION

1. Field of the Invention

The present invention relates to a method of manufacturing a dynamic random access memory(DRAM), and more particularly, to a method of planarization for an inter layer dielectric (ILD) in the process of manufacturing a dynamic random access memory.

2. Description of the Prior Art

Dynamic random access memory (DRAM) devices are used extensively in the electronics industry for information storage. A high density DRAM, such as a 64 megabit DRAM, is comprised of millions of memory cells. Each memory cell on the DRAM chip is comprised of a pass transistor, e.g. a metal-oxide-semiconductor field-effect transistor (MOSFET), and a storage capacitor for storing charge. An embedded DRAM (EDRAM) is a type of integrated circuit (IC) that combines both DRAM circuits and logic circuits in a semiconductor substrate. Nowadays, the trend in manufacturing semiconductor ICs is the integration of memory cell arrays with high-speed logic circuit elements. For example, microprocessors or digital signal processors all have integrated circuits that incorporate embedded memory.

However, the prior method of fabricating an EDRAM encounters a serious topographical problem of an ILD layer before the implementation of a metallization process. More specifically, the problem of the prior method results from a large height difference on the ILD layer between a memory array area and a periphery circuit region in an EDRAM. The problem of height difference is a critical factor in determining the production yield.

Figure 1:
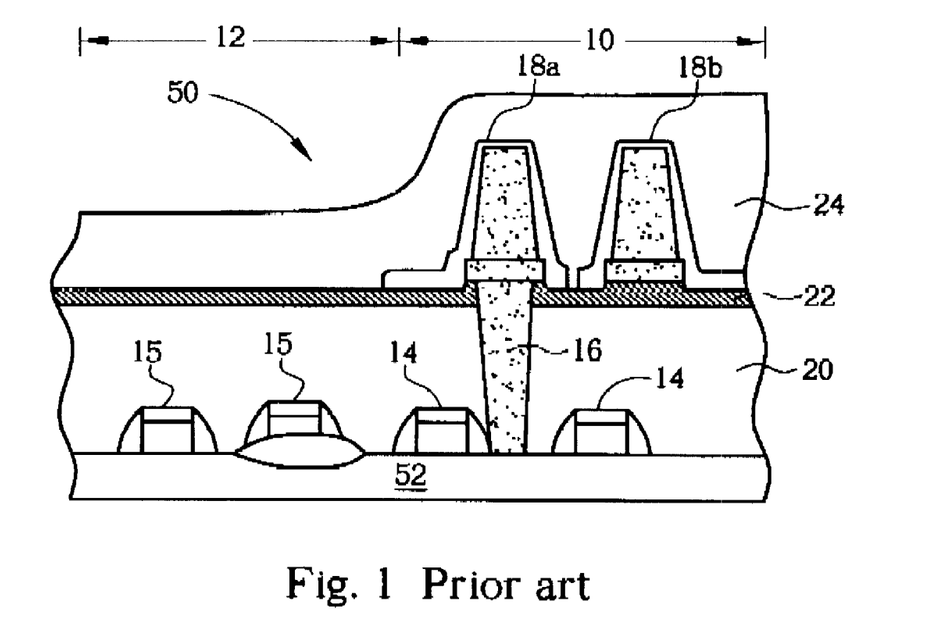
FIG. 1 to FIG. 8 are the schematic diagrams of the prior art.

The steps involved in manufacturing a conventional EDRAM on a semiconductor wafer 50 are illustrated in FIG. 1 to FIG. 8. Referring to FIG. 1, the semiconductor wafer 50 is comprised of a silicon substrate 52 on which a memory array area 10 and a periphery circuit region 12 are previously defined. The memory array area 10 is comprised of capacitors 18a, 18b and gates 14, while the periphery circuit region 12 is comprised of a plurality of gates 15 on the silicon substrate 52. In the memory array area 10, the capacitors 18a, 18b are formed on an atmospheric-pressure chemical vapor deposition (CVD) oxide (AP oxide) layer 22 of an approximately even surface. The gates 14, 15 are covered by a phosphosilicate glass (PSG) layer 20. A plug 16 formed in the AP oxide layer 22 and the PSG layer 20 functions to electrically connect the capacitors 18a and the underlying source or drain (not explicitly shown) within the silicon substrate 52.

In FIG. 1, a borophosphosilicate glass (BPSG) layer 24 acting as a buffer layer, covering both the memory array area 10 and the periphery circuit region 12, is first formed on the surface of the semiconductor wafer 50. A difference in height on the BPSG layer 24 is created between the memory array area 10 and the periphery circuit region 12 due to the presence of the capacitors 18a, 18b. The large height difference (step height), which ranges from 6000 to 9000 angstroms, can lead to a more complicated fabrication process due to difficulties in the formation of a contact window/plug in a subsequent fabrication process.

Figure 2:
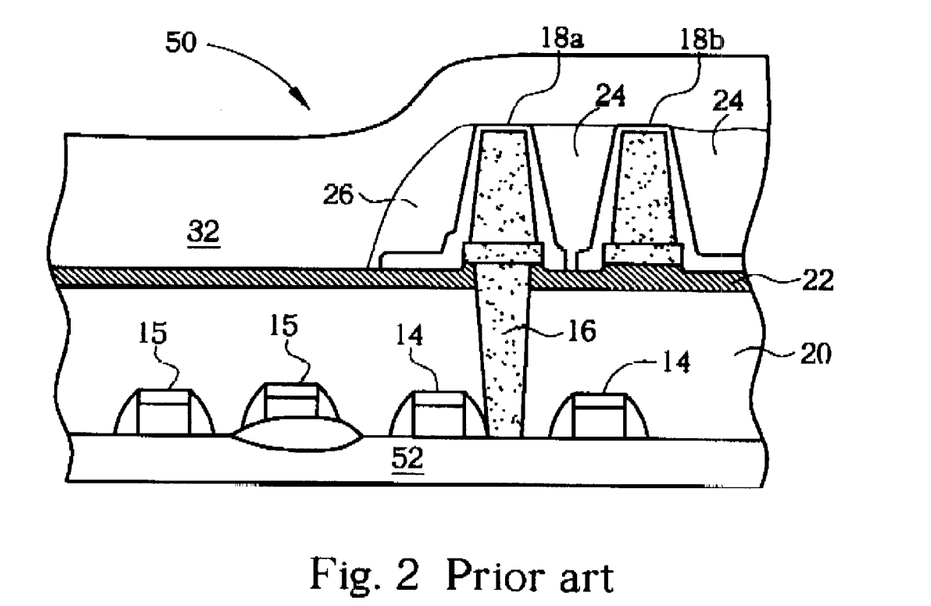

Referring to FIG. 2, a conventional anisotropic dry etching process is performed to etch the BPSG layer 24 down to the surface of the AP oxide layer 22 to form a spacer 26 along the edge of the memory array area 10. The spacer 26 functions to release the surface stress from the semiconductor wafer 50 that occurs in subsequent processes. Then, a PSG layer 32 with a thickness of approximately 3000 to 7000 angstroms is deposited on the surface of the semiconductor wafer 50. Thereafter, a thermal re-flow process is performed between the memory array area 10 and the periphery circuit region 12 to reduce the step height to approximately 4000 to 8000 angstroms.

Figure 3:
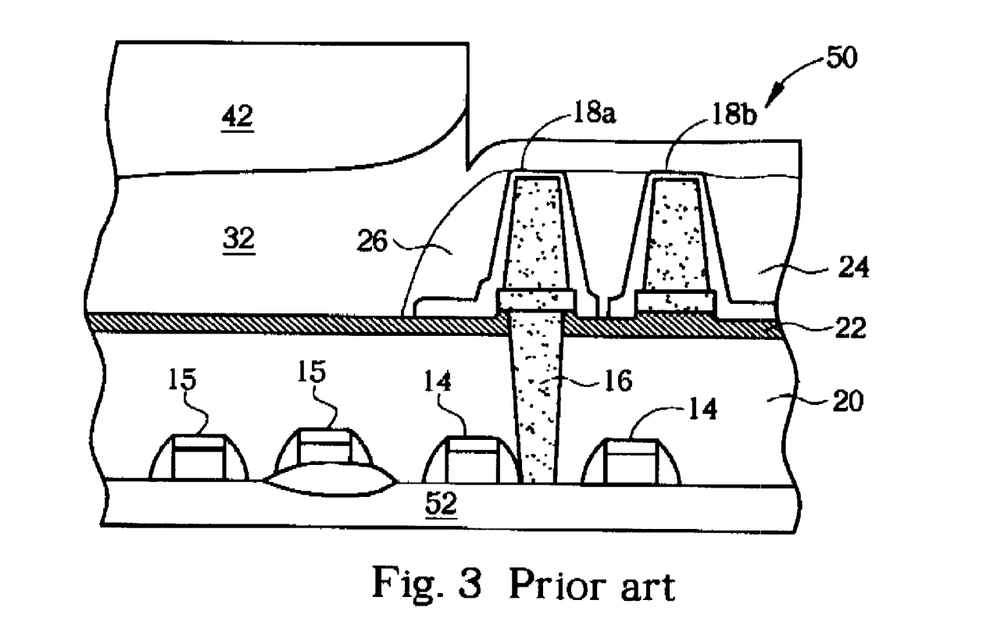
Figure 4:
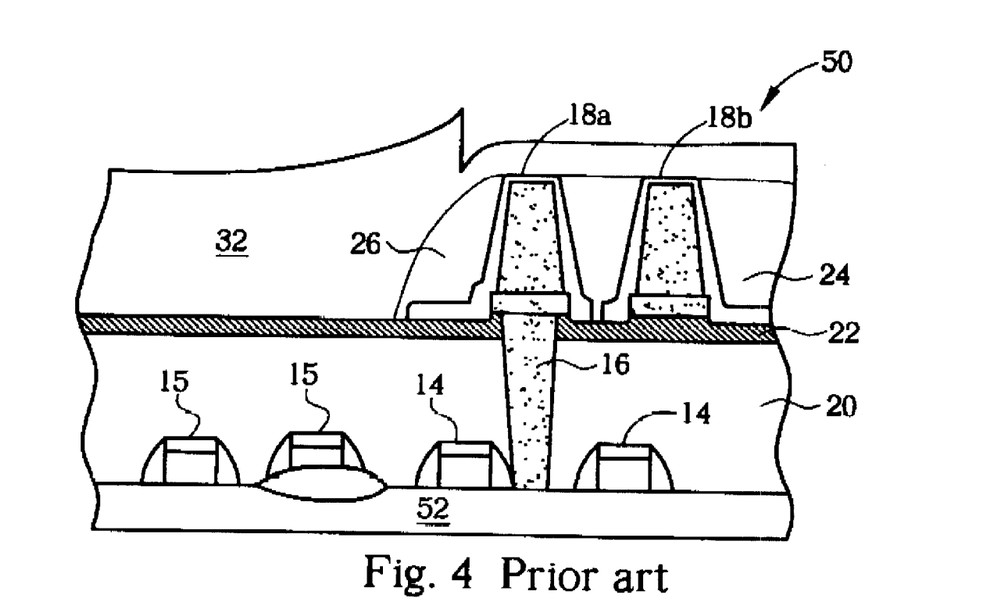

Referring now to FIG. 3, using a conventional lithographic method, a patterned and developed photoresist layer 42 is formed on the semiconductor wafer 50 to expose only the memory array area 10 in the BPSG layer 32. An etch back process is subsequently performed to etch away a predetermined thickness from the BPSG layer uncovered by the photoresist layer 42. The result is a BPSG layer 32 with a thickness of approximately 1000 angstroms covering the memory array area 10. Next, as shown in FIG. 4, a photoresist ashing process and a series of cleaning procedures are carefully performed to remove the photoresist layer 42 to obtain a clean semiconductor wafer surface.

Figure 5:
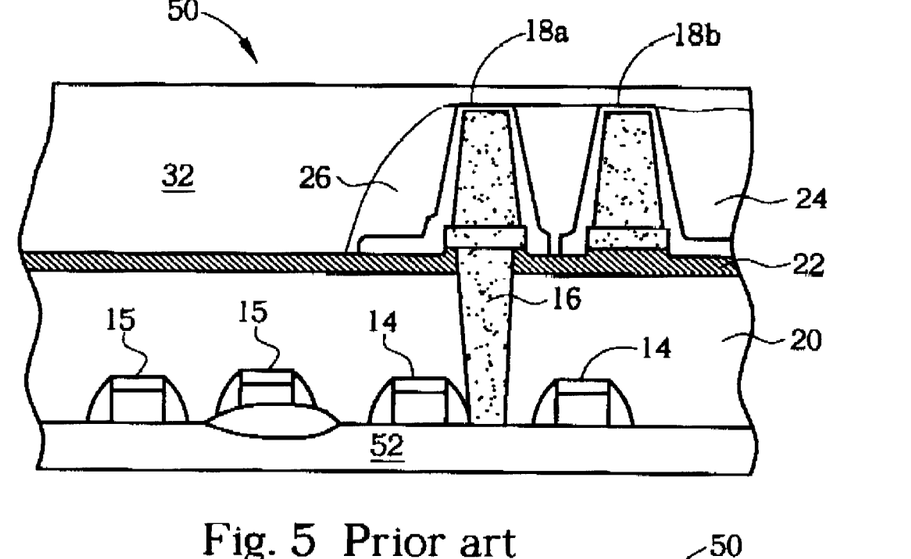
Figure 6:
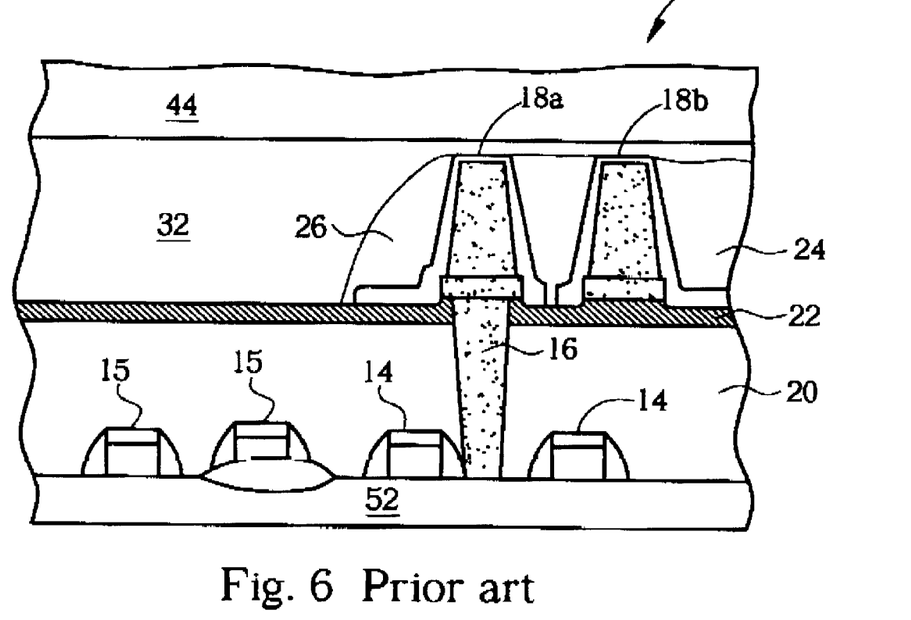

In FIG. 5, a conventional chemical mechanical polishing (CMP) process is performed to planarize the BPSG layer 32. Extreme caution must be taken during the CMP process to prevent breakthrough of the BPSG layer 32 over the capacitors 18a, 18b. To form a more uniform surface, as shown in FIG. 6, a conventional chemical vapor deposition (CVD) technique is performed to deposit a PSG layer 44, with an approximate thickness of 1000 angstroms, over the BPSG layer 32.

Figure 7:
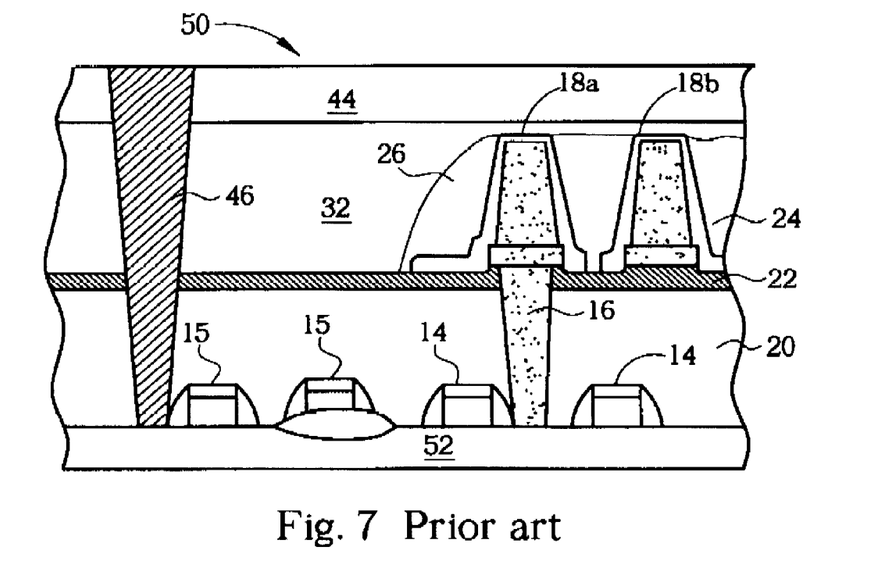
Figure 8:
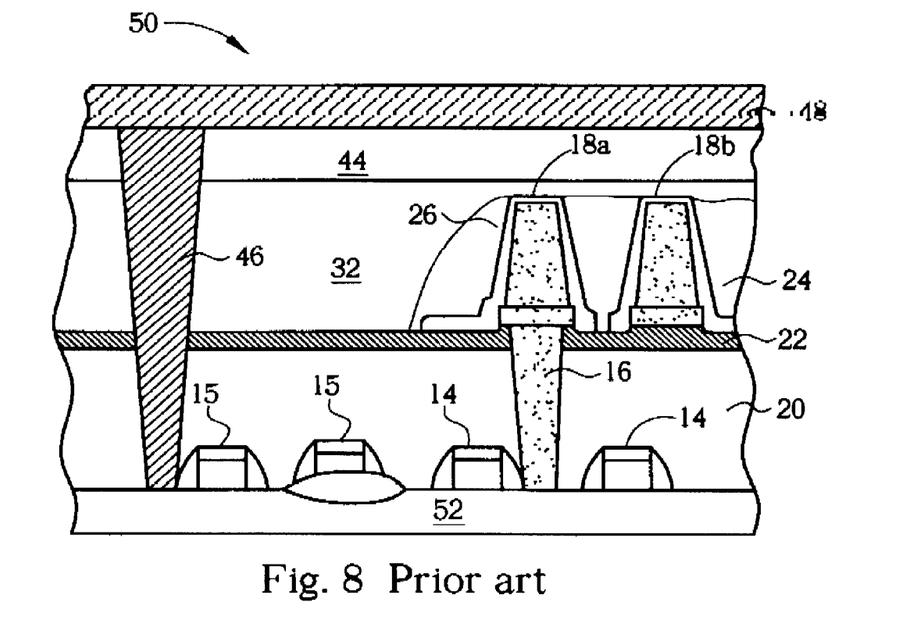

In FIG. 7, by means of both a conventional lithographic technique and a dry etching process, a contact plug 46 is formed in the periphery circuit region 12. The contact plug 46 spans the PSG layer 44, the AP oxide layer 22 and the PSG layer 20 through to the surface of the silicon substrate 52. The contact plug 46 functions to electrically couple a subsequently formed upper layer metal to the underlying devices on the silicon substrate 52. Finally, as shown in FIG. 8, a metal layer 48 is formed atop the PSG layer 44 to thereby complete the fabrication of a conventional EDRAM.

As indicated above, the prior method of fabricating an EDRAM has the following drawbacks: (1) the spacer 26 is required to release stress in the prior art process; (2) an additional BPSG layer 24 and an etching process are therefore needed to form the spacer 26; (3) an additional thick PSG layer 32 is required; (4) an additional thermal re-flow process is required to obtain a smoother PSG layer 32; (5) an additional lithographic process and an etching process are needed to remove a predetermined thickness from the PSG layer 32 over the memory array area 10; and (6) a costly CMP process is also needed. Consequently, the prior art method of fabricating an EDRAM is inefficient, time-consuming and costly.

The method of manufacturing an EDRAM according to the prior art is inefficient and time-consuming and the present invention can improve upon these drawbacks(5).

SUMMARY OF THE INVENTION

It is therefore an object of the present invention to provide an efficient and time-saving method for manufacturing an EDRAM. It is another object to provide a method for manufacturing an EDRAM to solve the above-mentioned problem of step height difference between the memory array area and the periphery circuit region.

In accordance with the claimed invention, the method comprises providing a semiconductor wafer having both a memory array area and a periphery circuit region defined on its surface, a plurality of metal oxide semiconductor (MOS) transistors installed in the periphery circuit region, and a plurality of metal oxide semiconductor (MOS) transistors and capacitors formed by a top electrode. Then, a dielectric layer and a storage node are installed in the memory array area. Next, a dielectric layer is formed on the surface of the semiconductor wafer covered by the metal oxide semiconductor(MOS) transistors and capacitors followed by the formation of a photoresist layer on the surface of the dielectric layer. Thereafter, a photolithographic process is performed to removeportions of the photoresist layer above the memory array area. The residual photoresist layer functions as a hard mask to etch the dielectric layer in the memory array area by a predetermined depth exceeding 6000 angstroms. Finally, a CMP process is performed to planarize the dielectric layer of the EDRAM.

It is an advantage of the present invention that a photolithographic process is performed through the use of layout patterns of either the top electrodes or the storage nodes of each of the capacitors. The patterns function as reverse masks to planarize the inter layer dielectric of the EDRAM. Thus, in contrast to the prior art, the present invention decreases both the complexity and cost of process.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 9:
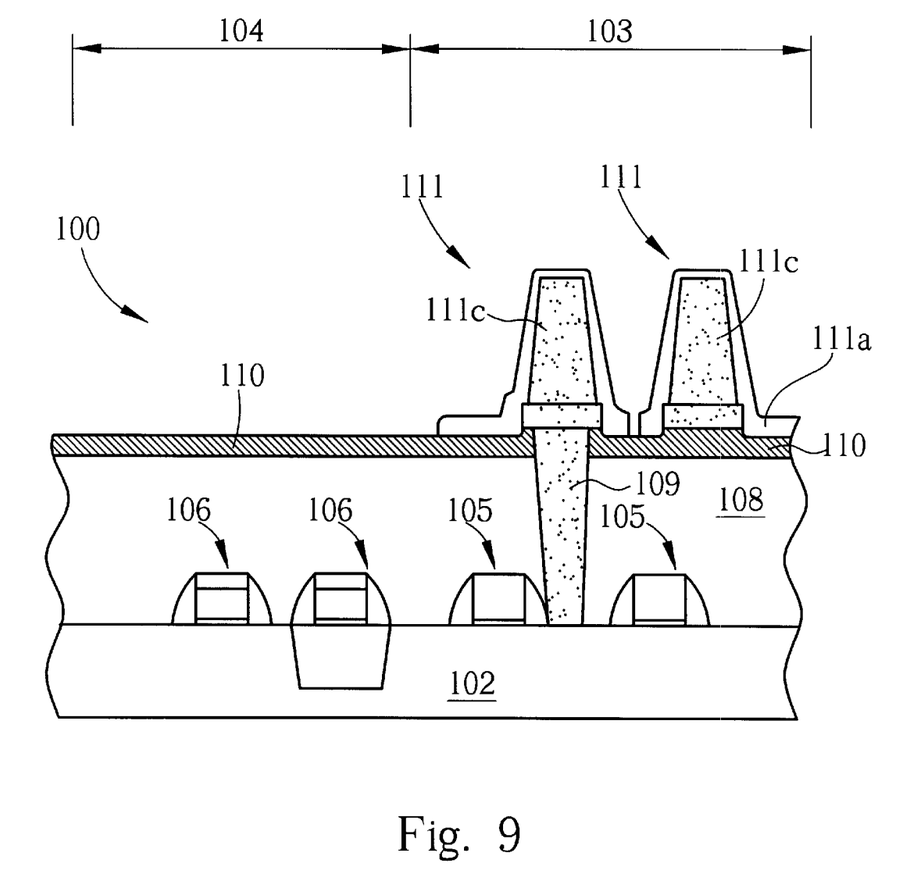
FIG. 9 to FIG. 13 are the schematic diagrams of the present invention.

Please refer to FIG. 9, FIG. 9 is a schematic diagram of manufacturing an EDRAM on a semiconductor wafer 100. As shown in FIG. 9, the semiconductor wafer 100 is comprised of a silicon substrate 102 with both a memory array area 103 and a periphery circuit region 104 defined on the surface of the silicon substrate 102. The memory array area 103 comprises of a plurality of gates 105 while the periphery circuit region 104 comprises of a plurality of gates 106.

The surface of the silicon substrate 102 is further comprised of both a planarized borophosphosilicate glass (BPSG) layer 108 and a silicon oxide layer 110. The BPSG layer 108 and the silicon oxide layer 110 cover the plurality of gates 105,106. Additionally, the memory array area 103 further comprises of a plurality of capacitors 111 and at least one node contact 109 that penetrates through the BPSG layer 108 and the silicon oxide layer 110. The node contact 109 electrically connects the drain and the source(not shown)of the plurality of gates 105 with the plurality of capacitors 111. The height of the node contact 109 is approximately 6000 angstroms while the height of each capacitor 111 is approximately 8000~10000 angstroms resulting in a serious step height difference between the memory array area 103 and the periphery circuit region 104.

Figure 10:
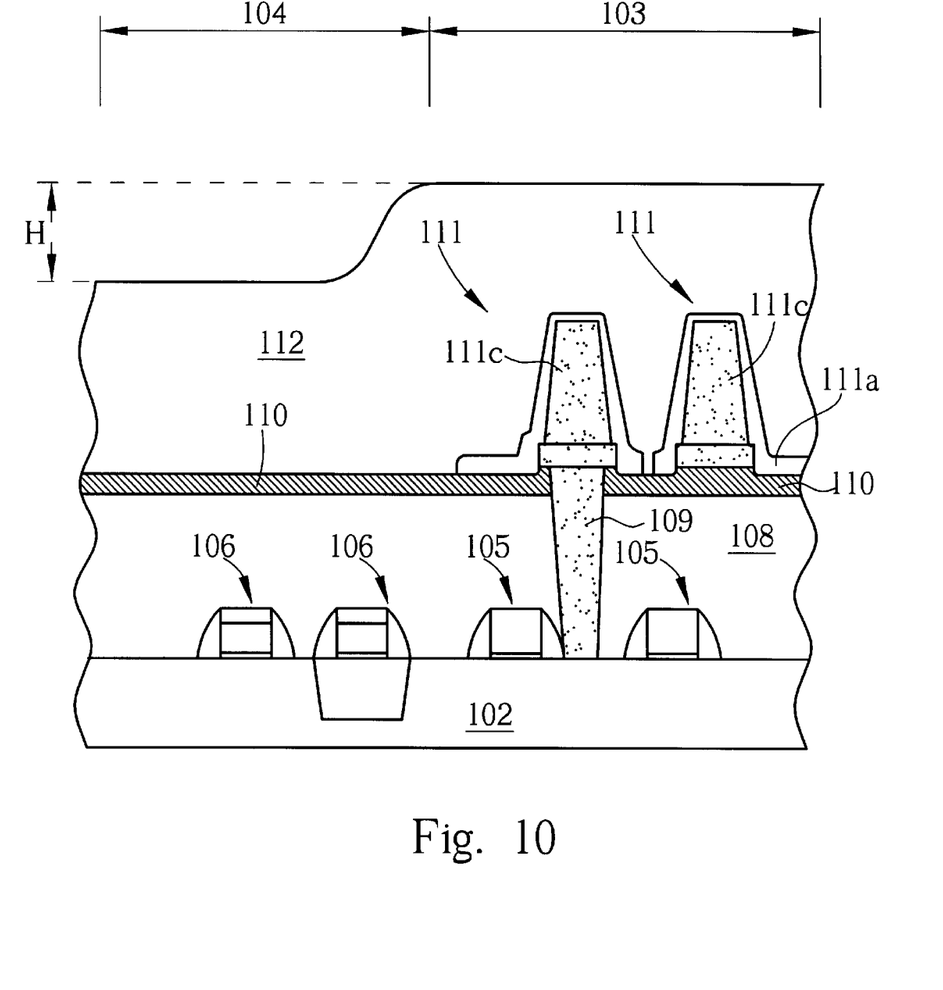

Referring to FIG. 10, a dielectric layer 112 is formed on the semiconductor wafer 100 to cover the capacitors 111 and the silicon oxide layer 110 wherein the material used for the dielectric layer 112 is most often silicon dioxide formed by the plasma enhanced chemical vapor deposition process. The step height difference between the memory array area 103 and the periphery circuit region 104 exceeds 7000 angstroms.

Figure 11:
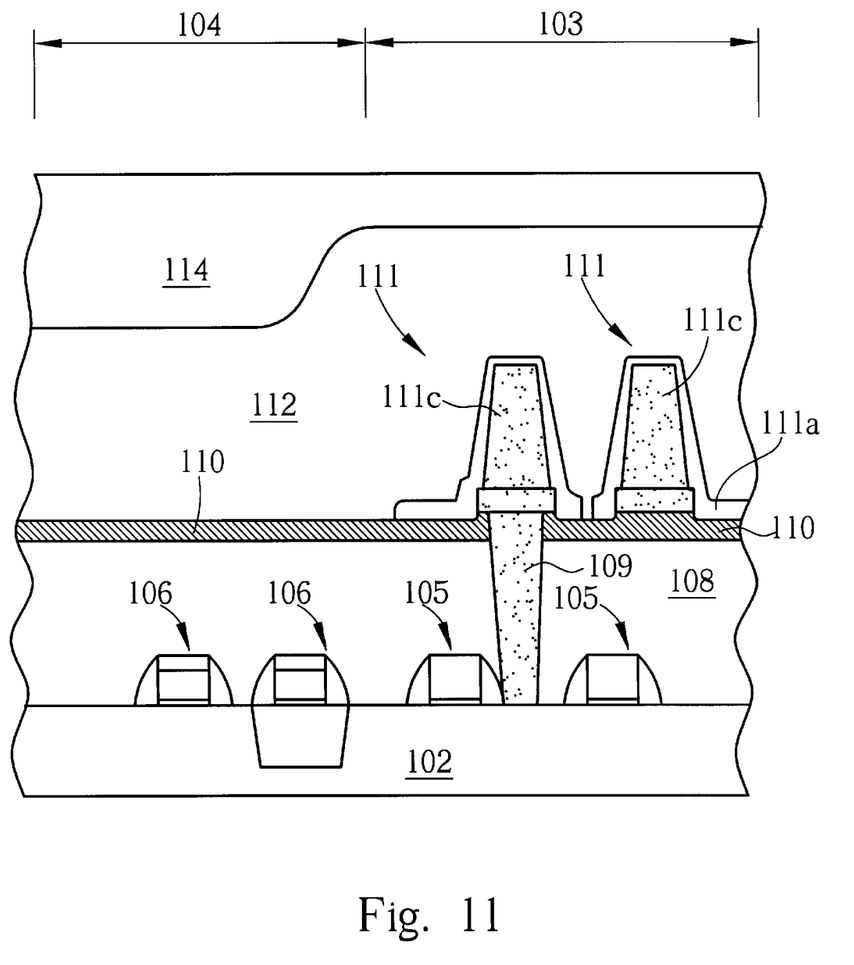

As shown in FIG. 11, a photoresist layer 114 is formed on the surface of the dielectric layer 112. Then, a photolithographic process is performed by using the layout patterns of either the capacitors 111, the storage nodes 111c, the top electrodes 111aor the bit line(not shown)as a reverse mask to remove portions of the photoresist layer 114 in the memory array area 103. The photolithographic process uses one of the above masks and utilizes the character of the positive and negative photoresist to form a photoresist layer (not shown) of the layout patterns. The layout patterns are the reverse of the original layout patterns of the capacitors 111, the storage nodes 111c, the top electrodes 111a or the bit line (not shown). The photolithographic process uses one of the layout patterns of the capacitors 111, the storage nodes 111c, the top electrodes 111a or the bit line (not shown) as a reverse mask to perform a pattern transfer and in addition, forms a hard mask of a photoresist layer with reverse layout patterns.

Figure 12:
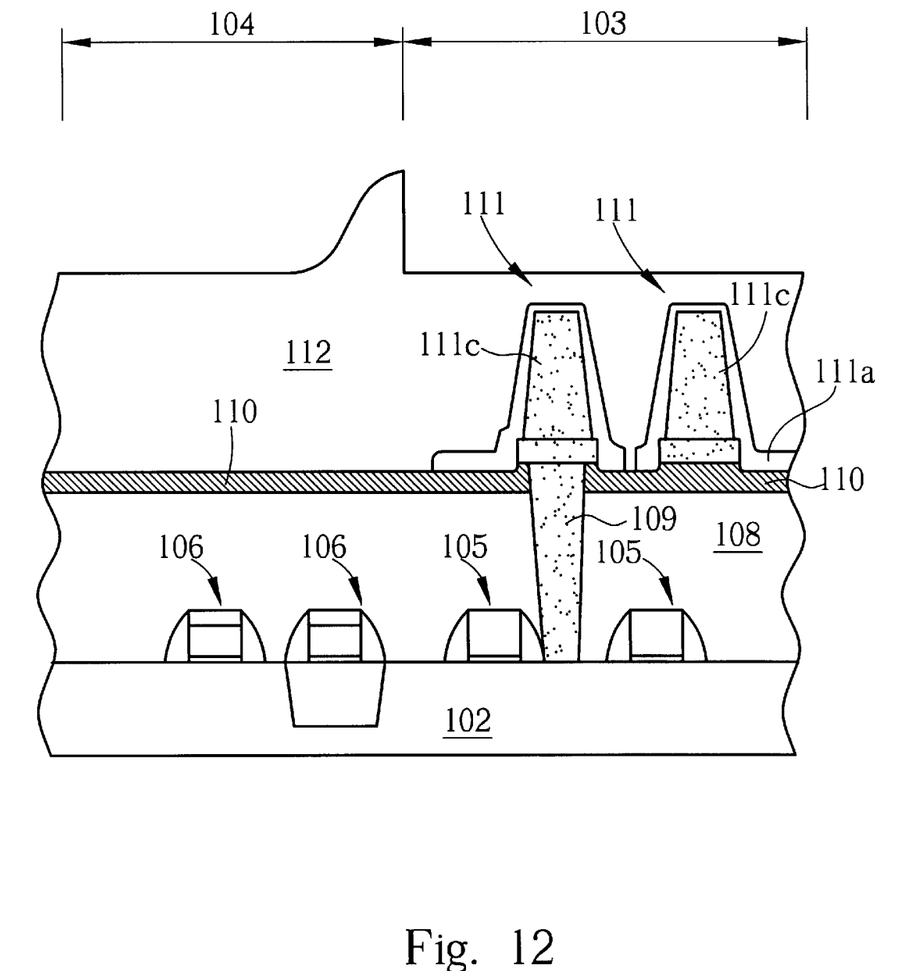
Figure 13:
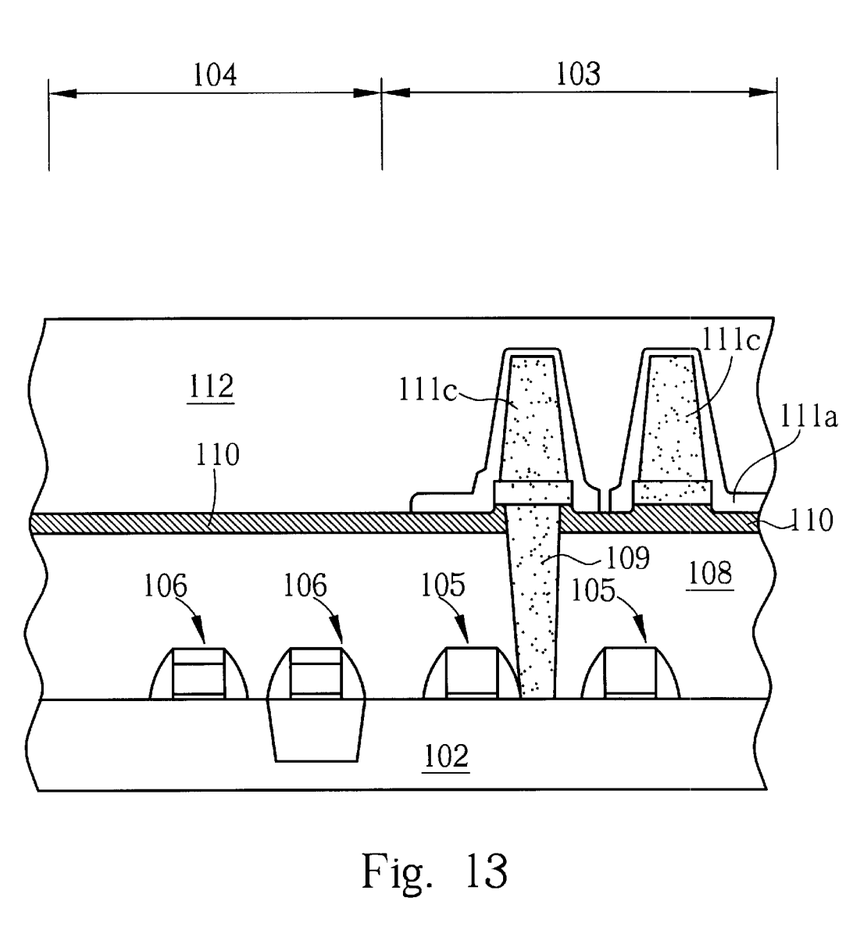

Because of the optical proximity effect, the photoresist layer 114 is approximately residual only in the periphery circuit region 104 and forms a hard mask only in the periphery circuit region 104 after development. Then, as shown in FIG. 12, an etching process is performed using the residual photoresist layer 114 in the periphery circuit region 104 as a hard mask to etch the dielectric layer 112 in the memory array area 103 by a predetermined depth exceeding 6000 angstroms. The predetermined depth should approximately equate the original step height difference. Finally, as shown in FIG. 13, a chemical mechanical polishing process is performed to planarize the dielectric layer 112 in both the memory array area 103 and the periphery circuit region 104.

In the preferred embodiment, the present invention uses the layout patterns of either the capacitors 111, the storage nodes 111c, the top electrodes 111aor the bit line (not shown) as a reverse mask to perform an etching process on the dielectric layer 112 within the memory array area 103. The purpose behind the above process is firstly, to save both time and cost by not remanufacturing a new mask. Secondly, the problem of the step height difference is resolved whereby the reverse mask directly protects the periphery circuit region 104 from a further etching process to supplement the optical proximity effect, or in conjunction with an aided over etching process.

The predetermined depth of the etching process in FIG. 12 of the preferred embodiment should approximately equate the original step height difference between the memory array area 103 and the periphery circuit region 104 of FIG. 9 to obtain the best process window.

In contrast to the prior art method, the method according to the present invention uses the repeated and quantity of layout patterns in a reverse mask. For example, the layout patterns of either the capacitors 111, the storage nodes 111c, the top electrodes 111a, the node contact 109 or the bit line(not shown) can be used as a reverse mask to etch the dielectric layer 112 within the memory array area 103. Therefore, the problem of the step height difference between the memory array area 103 and the periphery circuit region 104 is solved without manufacturing a new mask. Hence, the time and the cost of manufacturing a new mask are neglected to simplify the complicated processes of the prior art.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method to improve the planarization of an inter layer dielectric (ILD), the method comprising:

providing a semiconductor wafer having both a memory array area and a periphery circuit region defined on the surface of the semiconductor wafer, a plurality of metal oxide semiconductor (MOS) transistors being installed in the periphery circuit region, and a plurality of metal oxide semiconductor (MOS) transistors and capacitors being installed in the memory array area;

forming a dielectric layer on the surface of the semiconductor wafer that covers the metal oxide semiconductor (MOS) transistors and capacitors:

forming a photoresist layer on the surface of the dielectric layer;

performing a photolithographic process that uses the layout patterns of each of the capacitors as a reverse mask so as to remove the portions of the photoresist layer that are in the memory array area;

using the residual photoresist layer as a hard mask to etch a portion of the dielectric layer in the memory array area; and performing a planarization process on the dielectric layer.

2. The method of claim 1 wherein each of the capacitors is formed by a top electrode, a dielectric layer, and a storage node.

3. The method of claim 2 wherein the mask patterns of the photolithographic process are formed by using the layout patterns of the storage nodes of each of the capacitors as a reverse mask.

4. The method of claim 2 wherein the mask patterns of the photolithographic process are formed by using the layout patterns of the top electrodes of each of the capacitors as a reverse mask.

5. The method of claim 1 wherein a depth of the portion of the dielectric layer in the memory array area, which is etched by using the residual photoresist layer as a hard mask, exceeds 6000 angstroms.

6. The method of claim 1 wherein the planarization process is a chemical-mechanical polishing process.

* * * * *